United States Patent
Chao et al.

(10) Patent No.: US 8,969,904 B2
(45) Date of Patent: Mar. 3, 2015

(54) ORGANIC LIGHT EMITTING DISPLAY DEVICE

(71) Applicant: Innolux Corporation, Miao-Li County (TW)

(72) Inventors: Kuang-Pin Chao, Miao-Li County (TW); Hao-Jung Huang, Miao-Li County (TW); Min-Han Tsai, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 14/252,417

(22) Filed: Apr. 14, 2014

(65) Prior Publication Data

US 2014/0346477 A1 Nov. 27, 2014

(30) Foreign Application Priority Data

May 24, 2013 (TW) .............................. 102118415 A (51) Int. Cl.
*H01L 21/00* (2006.01)
*H01L 51/52* (2006.01)
*H01L 27/32* (2006.01)

(52) U.S. Cl.
CPC ........ *H01L 51/5237* (2013.01); *H01L 51/5253* (2013.01); *H01L 27/32* (2013.01)
USPC .................................. 257/98; 257/94; 257/40

(58) Field of Classification Search
USPC ................................................ 257/94, 98, 40
See application file for complete search history.

(56) References Cited

U.S. PATENT DOCUMENTS

| | | | | |
|---|---|---|---|---|
| 7,279,063 | B2 * | 10/2007 | Yokajty et al. | 156/275.5 |
| 8,330,360 | B2 * | 12/2012 | Frischknecht | 313/512 |
| 2007/0080905 | A1 * | 4/2007 | Takahara | 345/76 |
| 2007/0108459 | A1 * | 5/2007 | Lu | 257/98 |
| 2008/0224601 | A1 * | 9/2008 | Frischknecht | 313/504 |
| 2009/0161216 | A1 * | 6/2009 | Nam Goong et al. | 359/513 |
| 2013/0181602 | A1 * | 7/2013 | Kang et al. | 313/504 |

* cited by examiner

*Primary Examiner* — Laura Menz
(74) *Attorney, Agent, or Firm* — LI&Cai Intellectual Property (USA) Office (57) ABSTRACT

An organic light emitting display device includes a first substrate, an organic light emitting diode array, a thin film encapsulation layer, a second substrate, a sealant member and a buffer layer. First substrate has a light emitting region and a non-light emitting region. OLED array is configured in light emitting region covered by encapsulation layer. Second substrate has a color filter array and is arranged opposite first substrate. Sealant member is disposed between first and second substrates. Buffer layer has a first light shielding layer disposed thereon, is arranged between first and second substrates, and is configured in light emitting region. Light shielding layer is arranged between buffer layer and encapsulation layer. The sum of the buffer layer's thickness and a gap distance from buffer layer to encapsulation layer has a range from 5 to 20 µm. Buffer layer has hardness smaller than that of the color filter array.

14 Claims, 5 Drawing Sheets

ORGANIC LIGHT EMITTING DISPLAY DEVICE

BACKGROUND OF THE INVENTION

1. Field of the Invention

The present disclosure relates to a display device; in particular, to an organic light emitting display device.

2. Description of Related Art

Current organic light emitting display devices have relatively higher response speed, sharper color contrast, and barely any visual limitations in comparison to the conventional liquid crystal displace devices. Moreover, since organic light emitting display devices are self-emissive, backlight modules are not necessary, making the display device relatively lighter, less likely to be affected by external lighting in the ever changing environment, and compatible with indoor and outdoor uses.

Organic light emitting display devices typically include an upper substrate and a lower substrate. The lower substrate includes an organic light emitting element array and a thin film transistor array. The thin film transistor array controls the organic light emitting element array to display colored lighting in order to produces images. Typically, in the organic light emitting display device manufacturing process, an encapsulation layer covers over the organic light emitting element array after the organic light emitting elements array is completed on the lower substrate in order to prevent moisture intrusion, and in turn, reduce the service life of the organic light emitting elements. Successively, sealant structures or fillers are used when the upper and the lower substrate are pressed together to complete the packaging process.

During the production process of the organic light emitting display device, small particles having larger diameters than the thickness of the encapsulation layer are prone to remain on the lower substrate. Successively, after the encapsulation layer is formed on the organic light emitting element array, protrusions are generated at the outer surface of the encapsulation layer since the encapsulation layer entraps the small particles thereunder. When the upper and lower substrates are pressed together for assembly, the protrusions are prone to generate cracks or punctures at the encapsulation layer due to pressure when pressed against the upper substrate, which leads to moisture intrusion within the organic light emitting elements and reduction in service lives of the elements.

To address the above issues, the inventor strives via associated experience and research to present the present disclosure, which can effectively improve the limitation described above.

SUMMARY OF THE INVENTION

The object of the present disclosure is to provide an organic light emitting display device which includes a first substrate, an organic light emitting diode array, a thin film encapsulation layer, a second substrate, a sealant member and a buffer layer.

The first substrate has a light emitting region and a non-light emitting region. The organic light emitting diode array is arranged in the light emitting region of the first substrate. The thin film encapsulation layer covers the organic light emitting diode array. The first substrate and the second substrate are oppositely arranged, and the color filter array is correspondingly arranged in the light emitting region. The sealant member is interposed between the first substrate and the second substrate and disposed in the non-light emitting region. The buffer layer is interposed between the first substrate and the second substrate, and is arranged in the light emitting region. The buffer layer has a first light shielding layer interposed between the buffer layer and the thin film encapsulation layer. The buffer layer has a thickness. The buffer layer and the encapsulation layer are spaced apart by a gap having a gap distance. The sum of the thickness and the gap distance is equal to a total thickness ranging from 5 μm to 20 μm. The hardness of the buffer layer is smaller than that of the color filter array.

The present disclosure can provide a relatively large gap between the first substrate and the second substrate to accommodate the protrusions generated by the small particles that are entrapped under the thin film encapsulation layer, such that the chances of the encapsulation layer upwardly nudging the second substrate and subsequently breaking the encapsulation layer are reduced, as well as the chances of moisture intrusion within the organic light emitting diode array are reduced.

In order to further understand the present disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

The aforementioned illustrations and detailed descriptions are exemplarities for the purpose of further explaining the scope of the present disclosure. Other objectives and advantages related to the present disclosure will be illustrated in the subsequent descriptions and appended drawings.

Figure 1:
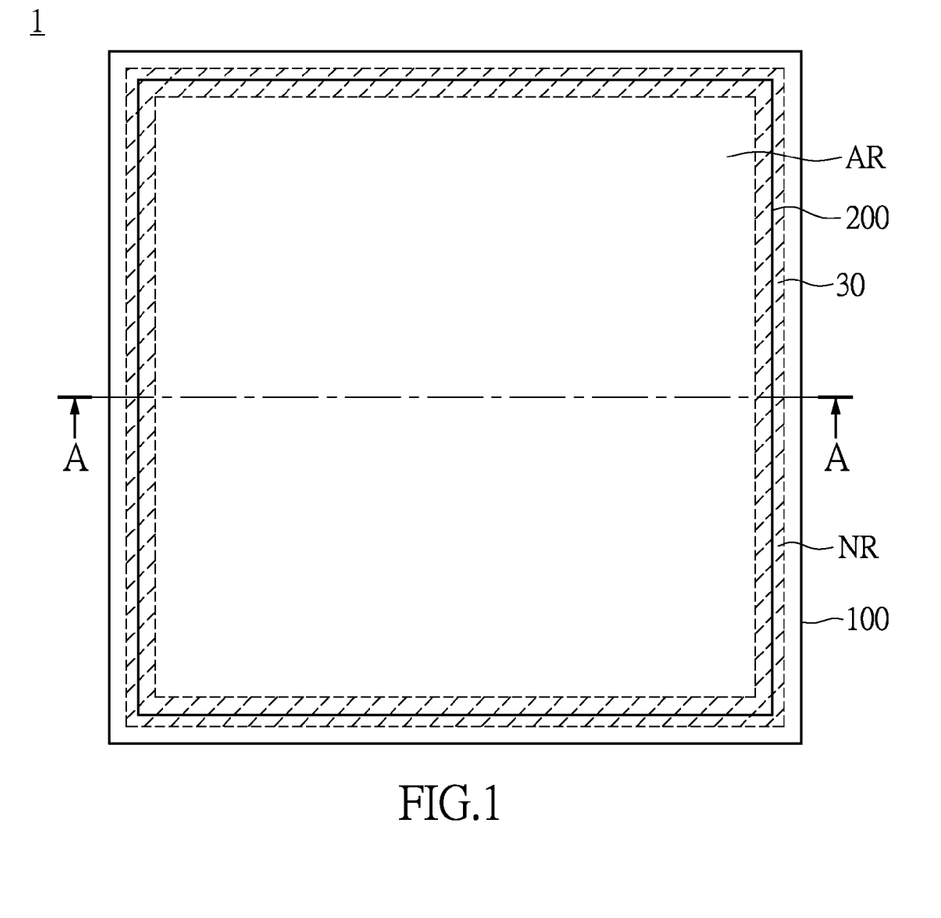
FIG. 1 is a top view of an organic light emitting display device in accordance with an embodiment of the present disclosure.

Please refer to FIG. 1 as a top view of an organic light emitting display device in accordance with an embodiment of the present disclosure. The organic light emitting display device 1 includes an active device array substrate 100, a color filter substrate 200, and a sealant member 30. The organic light emitting display device 1 defines a light emitting region AR, and a non-light emitting region NR peripherally arranged on portions of the first substrate corresponding to the light emitting region. In other words, the non-light emitting region NR surrounds the light emitting region AR. The active device array substrate 100 and the color filter substrate 200 have a plurality of elements forming a plurality of pixel arrays that is arranged in the light emitting region AR.

The sealant member 30 is arranged in the non-light emitting region NR and surrounds the light emitting region AR, such that the active device array substrate 100 and the color filter substrate 200 are mutually coupled after fittingly combined together. The sealant member 30 seals the plurality of elements that are arranged on the active device array substrate 100 and the color filter substrate 200 therebetween, such that the elements are isolated from moisture and air in the atmosphere. The sealant member 30 is made of water-resistant materials such as sealants or adhesives.

Figure 2A:
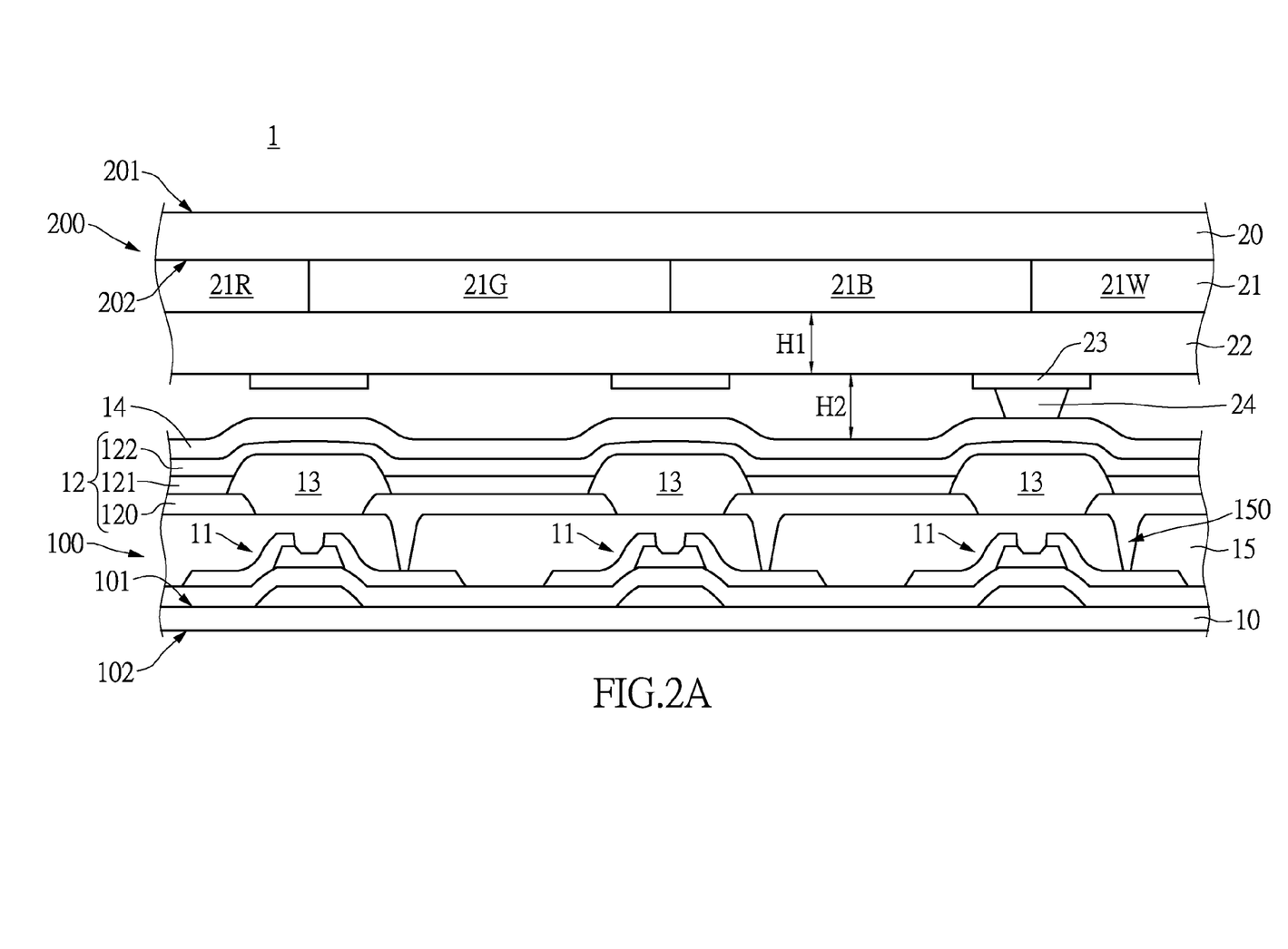
FIG. 2A is a partial cross-section of the organic light emitting display device along an A-A cut line as shown in FIG. 1 in accordance with the present disclosure.

Please refer to FIG. 2A as a partial cross-section of the organic light emitting display device along an A-A cut line as shown in FIG. 1. In the present embodiment, the active device array substrate 100 includes a first substrate 10, a thin film transistor array 11, an organic light emitting diode array 12, a pixel defining layer 13, and a thin film encapsulation layer 14.

The first substrate 10 is made of transparent materials such as glass, transparent polymers, or quartz. The first substrate 10 has a loading surface 101, and a base surface 102 arranged opposite to the loading surface 101. The loading surface 101 has the light emitting region AR and the non-light emitting region NR defined thereon. The thin film transistor array 11, the organic light emitting diode array 12, and the pixel defining layer (PDL) 13 are arranged in the light emitting region AR.

When the thin film transistor array 11 is formed on the first substrate 10, a planarization layer 15 isolates the thin film transistor array 11 from the other elements. The pixel defining layer 13 is formed on the planarization layer 15. In one embodiment, the pixel defining layer 13 is a photoresist exposed and developed to form the patterned pixel defining layer 13, and defines a plurality of pixel regions. Organic light emitting diodes (OLED) in the organic light emitting diode array 12 are respectively formed in the plurality of pixel regions.

Specifically, the organic light emitting diode array 12 includes a first electrode layer 120, an organic light emitting layer 121, and a second electrode layer 122. The first electrode layer 120 of the present embodiment is an anode layer, and the second electrode layer 122 is a cathode layer. The first electrode layer 120 is formed on the planarization layer 15. The first electrode layer 120 is electrically connected to each drain electrode of each transistor element in the thin film transistor array 11 through a plurality of contact holes 150 on the planarization layer 15. In an embodiment, the first electrode layer 120 is a transparent conductive oxide layer that is made of materials such as indium oxide, tin oxide, zinc oxide, indium tin oxide (ITO), or indium zinc oxide (IZO). In another embodiment, the first electrode layer 120 can be a non-transparent or opaque metal layer that can also function as a reflective layer to improve light emitting efficiency of the OLED elements. The first electrode layer 120 can be a material selected from the group consisting of platinum (Pt), gold (Au), silver (Ag), chromium (Cr), and tungsen (W). The first electrode layer 120 can also include a plurality of electrode layers to form multiple-layers electrode structure such as ITO/Ag/ITO.

The organic light emitting layer 121 forms on the first electrode layer 120. In one embodiment, the organic light emitting layer 121 can be of polymer materials emitting various colors of light at various pixel regions, in which the various colors of light can be red, blue, green and white, whereas the polymer materials can be small molecules (OLED) or large molecules (PLED). In another embodiment, the organic light emitting layer 121 can be of polymer materials emitting identical colors of light in all pixel regions. The embodiment as shown in FIG. 2A, the organic light emitting layer 121 capable of emitting white light can be formed in each of the pixel regions. When the thin film transistor inputs signals to the OLED and applies voltage across the organic light emitting layer 121, electron holes of the organic light emitting layer 121 are filled, such that energy is emitted therefrom and transformed into visible light via the organic light emitting layer 121.

The second electrode layer 122 continuously and thoroughly covers over the organic light emitting layer 121 and the pixel defining layer 13. The second electrode layer 122 directly contacts the organic light emitting layer 121. In one embodiment, the second electrode layer 122 is a transparent conductive oxide layer, and the second electrode layer 122 is made of materials such as indium oxide, tin oxide, zinc oxide, indium tin oxide (ITO), or indium zinc oxide (IZO). The second electrode layer 122 can also include a plurality of electrode layers to form multiple-layers electrode structures.

The thin film encapsulation layer 14 thoroughly covers the organic light emitting diode array 12 to reduce moisture from penetrating the organic light emitting diode array 12 and the chances of damaging OLED elements. In an embodiment, the thin film encapsulation layer 14 has a thickness ranges from 1 μm to 10 μm. The thin film encapsulation layer 14 can be made of silicon nitride or silicon oxide. The thin film encapsulation layer 14 can be formed by chemical vapor deposition (CVD).

In the present embodiment, the color filter substrate 200 can include a second substrate 20, a color filter array 21, a buffer layer 22, a first light shielding layer 23 and a plurality of spacers 24.

The second substrate 20 is made of transparent materials similar to the first substrate 10 such as glass, transparent polymer, and quartz. The second substrate 20 has a first surface 201 and a second surface 202 opposite to the first surface 201. The second surface is defined with the light emitting region AR and the non-light emitting region NR thereon. Specifically, the color filter array 21, the buffer layer 22, and the first light shielding layer 23 are formed on the second surface 202 and are partially arranged in the light emitting region AR. Furthermore, the color filter array 21, the buffer layer 22, and the first light shielding layer 23 are sequentially formed on the second surface 202.

The color filter array 21 includes a plurality of color filter layers corresponding to various colors such as red color filter layer 21R, green color filter layer 21G, blue color filter layer 21B, and white color filter layer 21W. The color filter layers respectively correspond to the plurality of pixel regions defined by the pixel defining layer 13 to be arranged in array configuration. The white color filter 21W can be selectively arranged.

The buffer layer 22 is disposed on the color filter array 21 in order to reduce the chances of the thin film encapsulation layer 14 from cracks or punctures due to pressure or other factors, such as when the small particles disposed on OLED elements are pressed against the thin film, during manufacturing.

Specifically, the buffer layer 22 has hardness less than a hardness of the thin film encapsulation layer 14. The hardness is the indication of the material's hardness performance, where the unit of measure can be pencil hardness, Rockwell hardness or Vickers hardness. The buffer layer 22 can be made of materials such as acrylic, polyimide (PI), or polyethylene (PE) photoresist materials. In an embodiment, the hardness of the buffer layer 22 can be even less than the hardness of the color filter layer, and the lowest in hardness with respect to the other functional layers in the organic light emitting display device 1. Specifically, in the scale of pencil hardness, the hardness of the buffer layer 22 ranges from 4H to 6B. In an embodiment, the buffer layer 22 can be soft photoresist such as acrylic, PI or PE photoresists. The buffer layer 22 can be formed on the surface of the color filter array 21 by coating the photoresist thereon and hardened by curing or UV light.

In another embodiment, the buffer layer 22 and the white color filter layer 21W are made of substantially the same materials such as acrylic, PI, or PE photoresists. In the present embodiment, since the color filter array 21 includes the white color filter layer 21W, the white color filter layer 21W and the buffer layer 22 can be formed at the same process. That is, when the buffer layer 22 is formed on the color filter array 21, the white color filter layer 21W also can be formed. In another embodiment, the buffer layer 22 can be made of flexible materials such as acrylic, PI, or PE photoresists in order to tolerate deformation. Moreover, the buffer layer 22 has a thickness H1 of at least 3 μm, whereas the light transmittance rate can range from 60% to 99%. When the buffer layer 22 is interposed between the color filter array 21 and the thin film encapsulation layer 14, the buffer layer 22 must have a refractive index larger than a refractive index of the color filer array 21.

The first light shielding layer 23 is formed on the buffer layer 22 and correspondingly formed on each junction of the color filter layers. Specifically, the first light shielding layer 23 is a black matrix layer such as a black photoresist layer or a chromium (Cr) thin film which extends to the non-light emitting region NR (not shown in figures). Notably, since the buffer layer 22 has a thickness H1, when the active device array substrate 100 and the color filter substrate 200 are fittingly combined together, a gap having a gap distance of at least 9 μm is formed between the first and the second substrate 10, 20. Typically, the organic light emitting display device is more prone to lateral light leakage at vertically increasing viewing angles as the gap between the first light shielding layer 23 and the organic light emitting diode array 12 increases, which reduces display quality. The first light shielding layer 23 of the present embodiment is formed on the buffer layer 22 and not directly formed on the color filter array 21. In other words, the gap between the first light shielding layer 23 and the second electrode layer 22 remains to between 3 to 8 μm, which reduces the chances of lateral light leakage.

A plurality of spacers 24 are formed on the first light shielding layer 23 to provide support during the fittingly combined together of the color filter substrate 200 and the active device array substrate 100, and to provide a predetermined isolating distance therebetween, in which the predetermined distance ranges from 1 μm to 2 μm. The gap formed between the color filter substrate 200 and the active device array substrate 100 can be selectively filled in with filler materials or remain vacuum. In another embodiment, portions of the plurality of spacers 24 are disposed on the buffer layer 22, whereas other portions are disposed on the first light shielding layer 23. In another embodiment, the plurality of spacers 24 is directly disposed on the buffer layer 22.

When the color filter substrate 200 and the active device array substrate 100 are fittingly combined together, such that the second surface 202 of the second substrate 20 faces loading surface 101 of the first substrate 10. Subsequently, the color filter array 21, the buffer layer 22, and the first light shielding layer 23 are all interposed between the first substrate 10 and the second substrate 20. After assembled, the color filter array 21, the buffer layer 22, and the first light shielding layer 23 are interposed between the second substrate 20 and the thin film encapsulation layer 14. Moreover, the first light shielding layer 23 arranged in the light emitting region AR is in alignment with the positions of the pixel defining layer 13 on the active device array substrate 100. In addition, a total thickness which is the sum of the thickness H1 of the buffer layer 22 and a gap distance H2 between the buffer layer 22 and the thin film encapsulation layer 14 has a range from 5 to 20 μm, whereas the thickness H1 of the buffer layer 22 ranges from 3 μm to 18 μm.

Even if small particles remaining on the loading surface 101 of the first substrate 10 are also enclosed by the thin film encapsulation layer 14 during production of the active device array substrate 100, protrusions generated, which are due to small particles, at the outer surface of the thin film encapsulation layer 14 can be accommodated within the extra room or space created by the protrusion when pressure is applied on the active device array substrate 100 and the color filer substrate 200 during the combining fitting process. The material of the buffer layer 22 in the present embodiment is relatively soft or flexible, such that when the protrusions at the outer surface of the thin film encapsulation layer 14 upwardly nudges against the buffer layer 22, the buffer layer 22 can deform to absorb the stress generated from the protrusion and reduce the amount of stress that the encapsulation layer 14 applied against the relatively harder second substrate 20. In turn, the chances of cracking generated on the thin film encapsulation layer 14 are reduced to prevent moisture from penetrating the organic light emitting diode array 11.

In the present embodiment, the first light shielding layer 23 can be disposed on the buffer layer 22 in order to reduce a gap distance between the first light shielding layer 23 and the second electrode layer 122, such that lateral light leakage at vertically increasing viewing angles is reduced.

Figure 2B:
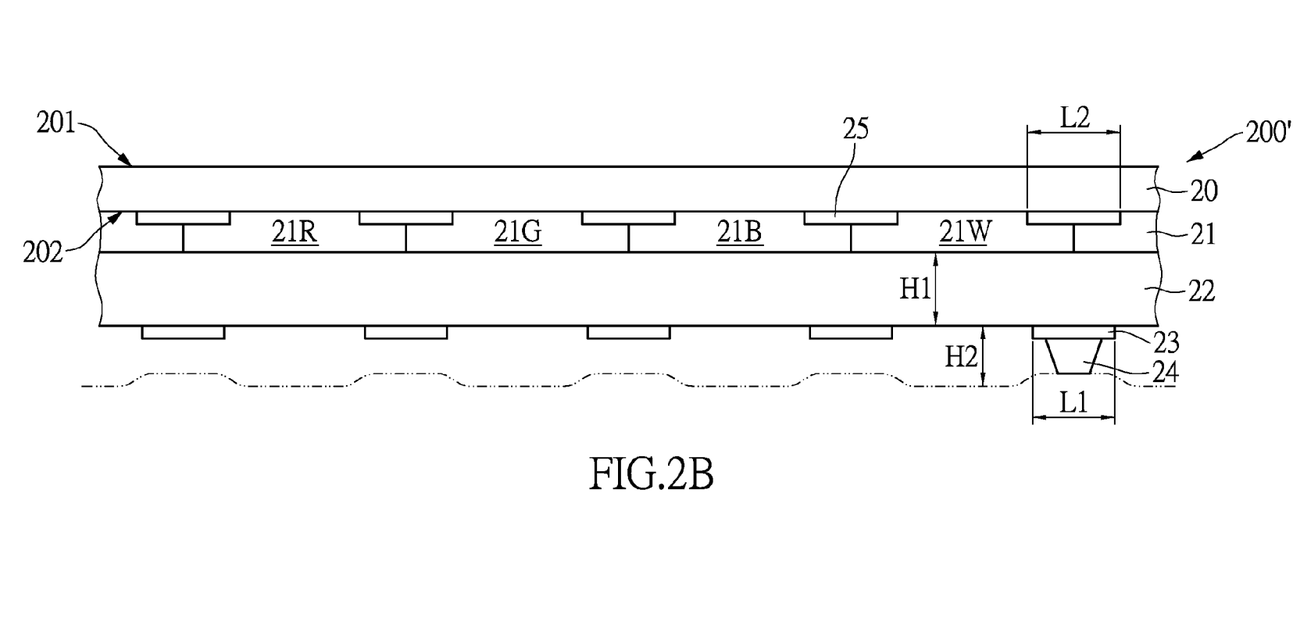
FIG. 2B is a color filter substrate in accordance with an embodiment of the present disclosure.

Please refer to FIG. 2B, which illustrates the color filter substrate in another embodiment. Besides the second substrate 20', the color filter array 21 (red, green blue, and white filter layers), the buffer layer 22, the first light shielding layer 23 and a plurality of spacers 24, the color filter substrate 200' in the present embodiment further includes a second light shielding layer 25. The arrangement of each element similar to the previous embodiment is not further discussed herein, rather the differences are further discussed as follow.

In the present embodiment, the second light shielding layer 25, the color filter array 21, the buffer layer 22 and the first light shielding layer 23 are sequentially stacked on the second surface 202. In other words, the second light shielding layer 25 is interposed between the second substrate 20 and the color filter array 21. In another embodiment, the second light shielding layer 25 can also be interposed between the color filter array 21 and the buffer layer 22.

Specifically, the second light shielding layer 25 is disposed at a junction point between two color filter layers (ex. respectively disposed at a junction point between the red and green color filter layers 21R, 21G, or between the green and the blue color filter layers 21G, 21B, or between the blue and the white color filter layers 21B, 21W) corresponding to the deposition of the first light shielding layer 23. In other words, when viewing from the second surface 202 of the second substrate 20 to the first surface 201, the first light shielding layer 23 is disposed above and overlaps the second light shielding layer 25. The first and the second light shielding layers 23, 25 are black matrix layers such as black photoresist layers or chromium films. Moreover, in one embodiment, the second light shielding layer 25 that is arranged in the light emitting region AR has a line width L2 larger than or equal to a line width L1 of the first light shielding layer 23, such that the second light shielding layer 25 can be an auxiliary preventive measure to the first shielding layer 23 for lateral light leakage in the organic light emitting display device 1 and also shield environmental lighting from entering the second substrate 20 in order to prevent the colors shades of OLED and the environmental lighting from mixing with one another, which can affect display quality.

Figure 3A:
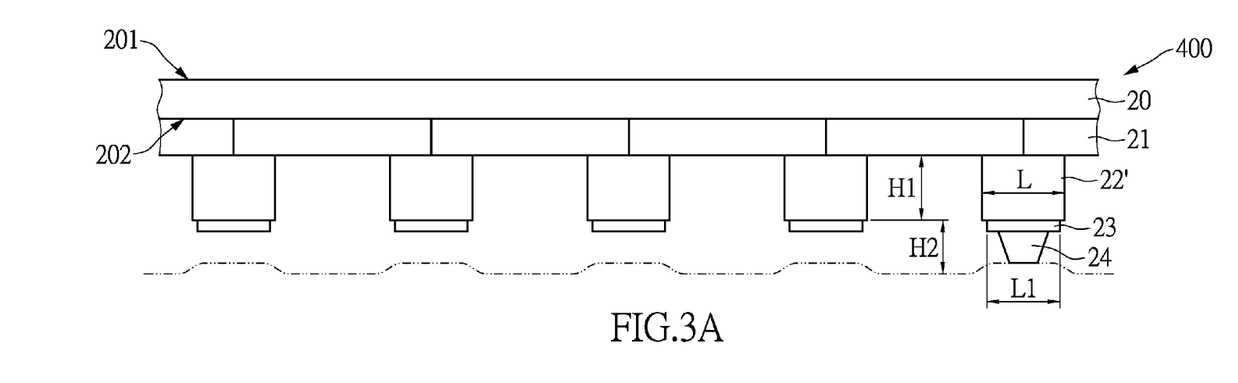
FIG. 3A is a color filter substrate in accordance with another embodiment of the present disclosure.

Please refer to FIG. 3A as another embodiment illustrating the color filter substrate of the organic light emitting display device. In the present embodiment, the color filter substrate 400 includes the second substrate 20, the color filter array 21, the buffer layer 22', the first light shielding layer 23, and a plurality of spacers 24. The arrangement of each element similar to the previous embodiment is not further discussed herein, rather the differences are further discussed as follow.

In the present embodiment, the buffer layer 22' can be a reticular layer disposed on junction points between the color filter layers of the color filter array 21. In other words, the reticular buffer layer 22' has a plurality of grids that correspondingly aligns with the plurality of pixel regions on the first substrate 10. As aforementioned, the plurality of pixel regions is defined by the pixel defining layer 13. As a result of the alignment, the overall shapes of the buffer layer 22' and the first light shielding layer 23 from a top view are identical and overlapping. The first light shielding layer 23 is disposed on the buffer layer 22', and the gap distance between the second electrode layer 122 and the first light shielding layer 23 is maintained at a range of 3 to 8 μm in order to restrain lateral light leakage of the organic light emitting display device.

In the present embodiment, when a line width L of the buffer layer 22' is smaller than or equal the line width L1 of the first light shielding layer 23, the buffer layer 22' is not limited to materials made with relatively high light transmittance, while photoresists with relatively low light transmittance having hardness less than that of the thin film encapsulation layer 14 are also acceptable materials. In one embodiment, the buffer layer 22' is made of materials having relatively low light transmittance and a line width L larger than that of the first light shielding layer 23.

In one embodiment, the thickness H1 of the buffer layer 22' is at least 3 μm. After the color filter substrate 400 and the active device array substrate 100 are assembled, the total thickness (H1+H2) between the color filter array 21 and the thin film encapsulation layer 14 is about 5 μm to 20 μm. As shown in FIG. 2B, H1 is the thickness of the buffer layer 22', whereas H2 is the gap distance between the buffer layer 22' and the thin film encapsulation layer 14. With the gap distance therebetween, the protrusions generated by the encapsulated small particles, which are enclosed by the thin film encapsulation layer 14, have accommodating room that can minimize the chances of the thin film encapsulation layer 14 from upwardly nudged against the second substrate 20. In turn, the chances of the thin film encapsulation layer 14 cracking or puncture are reduced.

Figure 3B:
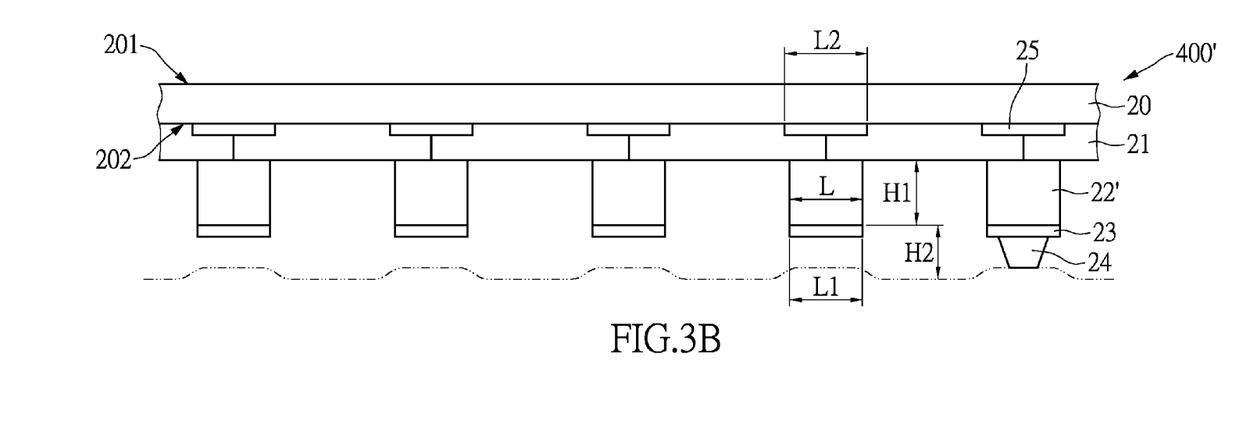
FIG. 3B is a color filter substrate in accordance with another embodiment of the present disclosure.

FIG. 3B illustrates the color filter substrate in accordance with another embodiment of the present disclosure. The present embodiment is similar to that in FIG. 2B, where the color filter substrate 400' includes the second substrate 20, the color filter array 21, the buffer layer 22', the first light shielding layer 23, a plurality of spacers 24, and the second light shielding layer 25. The second light shielding layer 25 can be interposed between the color filter array 21 and the second substrate 20. In another embodiment, the second light shielding layer 25 is interposed between the color filter array 21 and the buffer layer 22'. The arrangement of each element in the present embodiment is similar to that of the embodiment in FIG. 2B, and are not further discussed.

Figure 4:
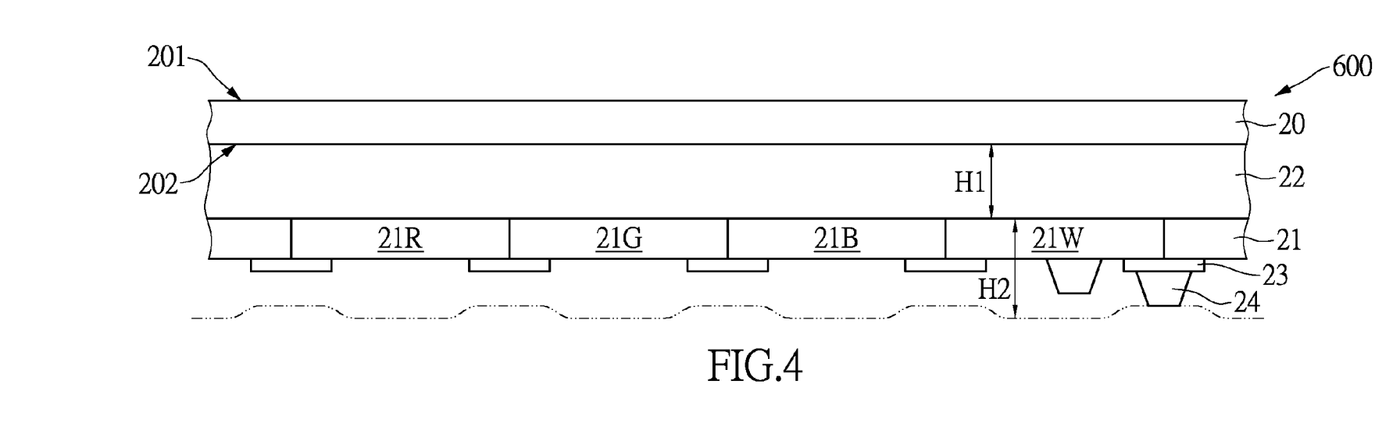
FIG. 4 is a color filter substrate in accordance with another embodiment of the present disclosure.

Please refer to FIG. 4 as the color filter substrate in accordance with another embodiment of the present disclosure. The color filter substrate 600 includes the second substrate 20, the color filter array 21, the buffer layer 22, the first light shielding layer 23, and the plurality of spacers 24. The differences between the present embodiment and the previous embodiment in that the buffer layer 22, the color filter array 21, and the first light shielding layer 23 are sequentially formed on the second surface 202 of the second substrate 20. In other words, the relatively positions of the buffer layer 22 and the color filter array 21 in the embodiment as shown in FIG. 2A are flipped with respective to that of the present embodiment, such that the buffer layer 22 is interposed between the second substrate 20 and the color filter array 21. The refractive index of the buffer layer 22 in the present embodiment is less than that of the color filter array 21.

In the present embodiment, if protrusions are generated due to small particles entrapped under the thin film encapsulation layer 14, the color filter array 21 is likely to partially contact the thin film encapsulation layer 14 when the color filter substrate 600 and the organic light emitting display device 100 are fittingly combined together. Since the thickness of the color filter array 21 is about 1 to 2 μm while having a hardness less than the thin film encapsulation layer 14, when the diameter of the small particles are relatively large, the thin film encapsulation layer 14 can also puncture through the color filter array 21 and contact the buffer layer 22. As a result, the buffer layer 22 of the present disclosure still requires a substantial thickness that can preferably prevent the thin film encapsulation layer 14 from breaking when upwardly nudged against the second substrate 20. The thickness H1 of the buffer layer 22 ranges from 3 μm to 18 μm.

In the present embodiment, the first light shielding layer 23 is arranged above the color filter array 21, and portions of the plurality of spacers 24 are directly disposed on the first light shielding layer 23, and portions of the plurality of spacers 24 are directly disposed on the color filter array 21. In another embodiment, the plurality of spacers 24 is directly disposed on the respective first light shielding layers 23. Moreover, in another embodiment, the plurality of spacers 24 is directly disposed on the color filter array 21.

Figure 5:
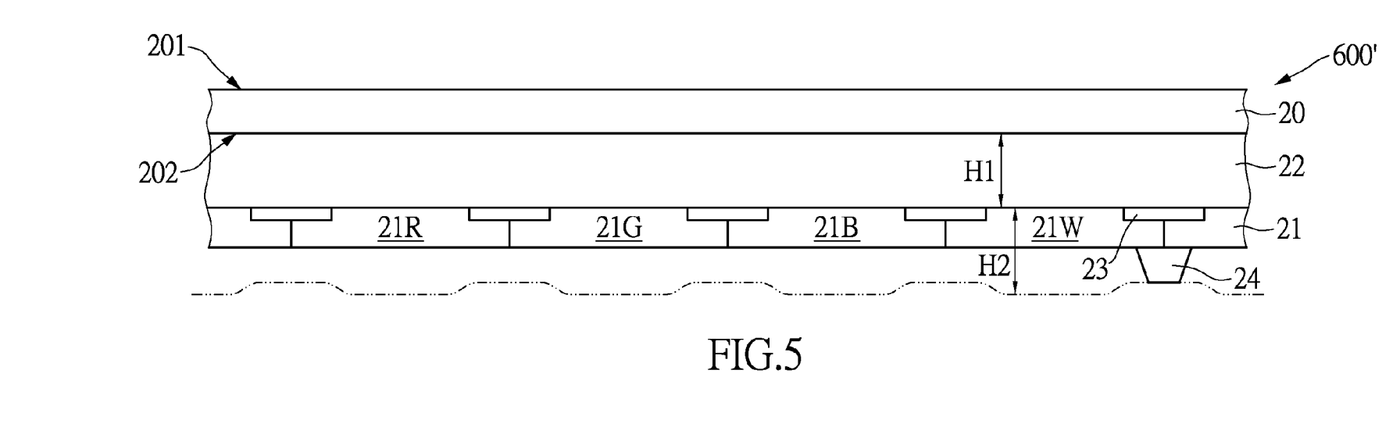
FIG. 5 is a color filter substrate in accordance with another embodiment of the present disclosure.

Please refer to FIG. 5 for the color filter substrate in accordance with another embodiment of the present disclosure. The relative arrangement and elements of the color filter substrate 600' are similar to that of the embodiment as shown in FIG. 4, thus are not further discussed herein. The differences between the present embodiment and the previous embodiment in that the first light shielding layer 23 is interposed between the buffer layer 22 and the color filter array 21. In the embodiments as shown in FIGS. 4 and 5, the color filter substrate 600, 600' also include the second light shielding layer 25, which are respectively disposed on the second surfaces 202 of the second substrates 20.

In summary, the buffer layer of the color filter substrate has a predetermined thickness, such that the first and the second substrate are spaced apart by a gap. Furthermore, due to the presence of the buffer layer, the protrusions generated by the small particles entrapped under the thin film encapsulation layer reduces nudging toward the second substrate having a relatively higher hardness when the color filter substrate and the active device array substrate are fittingly combined together. As a result, the chances of cracking and the subsequent moisture penetration within the organic light emitting display device are prevented.

The material of the buffer layer in the present embodiment is rather soft or flexible, such that when the protrusions of the thin film encapsulation layer nudge against the buffer layer, the buffer layer absorbs the stress due to the nudging of the protrusions and deforms in order to reduce the chances of the thin film encapsulation layer from nudging the second substrate. In other words, the buffer layer is a sacrificial layer.

Furthermore, the buffer layer also provides the positions in which the first light shielding layers are preferably disposed in order to reduce the distance between the first light shielding layer and the organic light emitting element array, such that lateral light leakage of the organic light emitting display device at vertically increasing viewing angles is prevented.

The figures and descriptions supra set forth illustrated the preferred embodiments of the present disclosure; however, the characteristics of the present disclosure are by no means restricted thereto. All changes, alternations, combinations or modifications conveniently considered by those skilled in the art are deemed to be encompassed within the scope of the present disclosure delineated by the following claims.

What is claimed is:

1. An organic light emitting display device, comprising:
a first substrate having a light emitting region and a non-light emitting region, and the non-light emitting region peripherally arranged on portions of the first substrate corresponding to the light emitting region;
an organic light emitting diode array disposed in the light emitting region of the first substrate;
a thin film encapsulation layer disposed on the organic light emitting diode array;
a second substrate arranged opposite to the first substrate corresponding to the light emitting region, and the second substrate having a color filter array disposed thereon;
a sealant member interposed between the first substrate and the second substrate, and disposed in the non-light emitting region;
a buffer layer interposed between the second substrate and the organic light emitting diode array, and arranged in the light emitting region; and
a first light shielding layer interposed between the buffer layer and the thin film encapsulation layer;
wherein the buffer layer has a thickness, the buffer layer and the thin film encapsulation layer have a gap defined therebetween, the gap is defined by a gap distance, a total thickness which is a sum of the thickness of the buffer layer and the gap distance has a range from 5 μm to 20 μm, and the buffer layer has a hardness smaller than a hardness of the color filter array.

2. The organic light emitting display device as recited in claim 1, wherein the thickness of the buffer layer ranges from 3 μm to 18 μm.

3. The organic light emitting display device as recited in claim 1, wherein the buffer layer has a light transmittance rate of about 60% to 99%.

4. The organic light emitting display device as recited in claim 1, wherein the color filter array is interposed between the buffer layer and the second substrate.

5. The organic light emitting display device as recited in claim 4, wherein the buffer layer has a refractive index larger than a refractive index of the color filter array.

6. The organic light emitting display device as recited in claim 4, wherein the buffer layer is a reticular layer, the buffer layer and the first light shielding layer have identical shapes and overlap one another.

7. The organic light emitting display device as recited in claim 6, wherein the buffer layer and the first light shielding layer have identical line widths.

8. The organic light emitting display device as recited in claim 4, further comprising a second light shielding layer interposed between the color filter array and the buffer layer, wherein the second light shielding layer overlaps the first light shielding layer, and the second light shielding layer has a line width larger than or equal to a line width of the first light shielding layer.

9. The organic light emitting display device as recited in claim 1, wherein the buffer layer is interposed between the second substrate and the color filter array, the buffer layer has a refractive index smaller than a refractive index of the color filter array.

10. The organic light emitting display device as recited in claim 9, wherein the first light shielding layer is interposed between the buffer layer and color filter array.

11. The organic light emitting display device as recited in claim 1, further comprising a second light shielding layer disposed on the second substrate, wherein the second light shielding layer overlaps the first light shielding layer, and the second light shielding layer has a line width larger than or equal to a line width of the first light shielding layer.

12. The organic light emitting display device as recited in claim 1, wherein the buffer layer partially contacts the thin film encapsulation layer.

13. The organic light emitting display device as recited in claim 1, wherein the color filter array partially contacts the thin film encapsulation layer.

14. The organic light emitting display device as recited in claim 1, wherein the buffer layer has a pencil hardness ranges from 4H to 6B.

* * * * *